(12) United States Patent
Hayashi et al.

(10) Patent No.: US 7,087,664 B2
(45) Date of Patent: Aug. 8, 2006

(54) RESIN FILM AND MULTILAYER PRINTED WIRING BOARD USING THEREOF

(75) Inventors: Toshiaki Hayashi, Tsukuba (JP); Katsuhiro Furuta, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 296 days.

(21) Appl. No.: 10/762,302

(22) Filed: Jan. 23, 2004

(65) Prior Publication Data

US 2004/0214005 A1  Oct. 28, 2004

(30) Foreign Application Priority Data

Jan. 31, 2003  (JP) .............................. 2003-023916

(51) Int. Cl.
*C08K 3/36* (2006.01)
*C08L 63/00* (2006.01)
*C08L 81/06* (2006.01)
*H05K 1/03* (2006.01)

(52) U.S. Cl. ...................... 523/466; 523/467; 525/107; 525/109; 525/113; 525/114; 525/120; 525/122; 525/438; 525/452; 525/481; 525/497; 525/502; 525/504; 525/508; 525/510; 525/523; 174/258

(58) Field of Classification Search .................... None
See application file for complete search history.

(56) References Cited

U.S. PATENT DOCUMENTS

| 5,641,997 A | * | 6/1997 | Ohta et al. ................... 257/788 |
| 6,410,145 B1 | * | 6/2002 | Hayashi et al. .............. 428/418 |
| 6,573,016 B1 | * | 6/2003 | Kami et al. ............... 430/58.05 |

FOREIGN PATENT DOCUMENTS

| JP | 07-33991 A | | 2/1995 |
| JP | 07-34048 A | | 2/1995 |
| JP | 11-35916 A | * | 2/1999 |
| JP | 11-100562 A | * | 4/1999 |
| JP | 2001-72834 A | | 3/2001 |

* cited by examiner

*Primary Examiner*—Robert Sellers
(74) *Attorney, Agent, or Firm*—Sughrue Mion, PLLC

(57) ABSTRACT

A resin film comprising (A) an epoxy resin having two or more glycidyl groups in a molecule, (B) an epoxy resin curing agent, (C) a thermoplastic resin, and (D) a filler, wherein the filler content in at least either one of the surface regions on the cross-section of the film is less than the filler concentration in the central region. The resin film has not only toughness but also fire retardancy, high interlayer adhesion strength and good processability of metal plating.

17 Claims, No Drawings

RESIN FILM AND MULTILAYER PRINTED WIRING BOARD USING THEREOF

BACKGROUND OF THE INVENTION

1. Field of the Invention

The present invention relates to a resin film and a multilayer printed wiring board containing an insulating layer obtained by curing said resin film, which are used suitably for insulation of electric and electronic fields.

2. Description of the Related Art

In multilayer printed wiring board carrying electronic parts such as LSI, represented by a mounting substrate (interposer), metal wires are arranged not only on the multilayer printed wiring board surface but also inside thereof in three dimensions. Such a multilayer printed wiring board may have stress by repetition of expansion by generation of heat of LSI etc. at the time of energization, and contraction at the time of stopping energization, and by the change of external temperature environment. Due to the stress, cracks may be generated in insulating layer of cured epoxy resin, and metal wires in a multilayer printed wiring board may be cut, thus there have been a problem of low electric reliability.

In order to cope with the problem, it is proposed that a film of an epoxy resin compounded with a polyether sulfone is cured, and the cured product is used as the insulating layer of a multilayer printed wiring board for increasing the toughness of a insulating layer of a multilayer printed wiring board. Moreover, using a filler as one component of a resin film for lowering the thermal expansion coefficient of insulating layer is proposed (JP-A-2001-72834).

However, as the insulating layer obtained by curing such a resin film, further improvements of fire retardancy and metal plating processability are required.

SUMMARY OF THE INVENTION

The object of the present invention is to provide a resin film which has not only toughness but also fire retardancy, high interlayer adhesion strength and good processability of metal plating, and to provide a multilayer printed wiring board containing an insulating layer obtained by curing said resin film.

As a result of intensive studies, the present inventors found out that the above problem can be solved by using a resin film having different filler content in thickness direction of the resin film, and accomplished the present invention.

Namely, the present invention is as follows.

[1] A resin film comprising (A) an epoxy resin having two or more glycidyl groups in a molecule, (B) an epoxy resin curing agent, (C) a thermoplastic resin, and (D) a filler, wherein the filler content in at least either one of the surface regions on the cross-section of the film is less than the filler content in the central region.

[2] A resin film according to [1], wherein two or more films are laminated.

[3] A resin film according to [1] or [2], wherein epoxy resin (A) having two or more glycidyl groups in a molecule is represented by following formula (1)

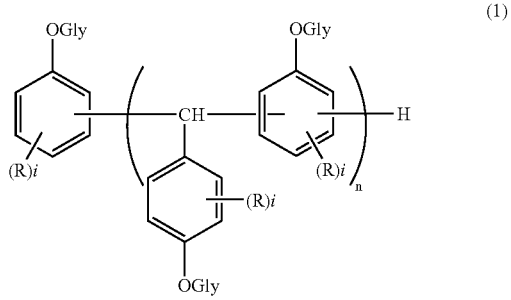

wherein, n represents an average repeating number of 1 to 10: A plurality of R each independently represents hydrogen atom, an alkyl group having 1–10 carbon atoms, an aralkyl group having 6–20 carbon atoms, an aromatic group having 6–20 carbon atoms, a cycloalkyl group having 5–7 carbon atoms or a hydrocarbon group having 6–20 carbon atoms containing a cycloalkyl group having 5–7 carbon atoms: i each independently represents an integer of 1–4: Gly represents glycidyl group.

[4] A resin film according to any one of [1] to [3], wherein epoxy resin curing agent (B) is phenol novolak.

[5] A resin film according to any one of [1] to [3], wherein a thermoplastic resin (C) is polyether sulfone.

[6] A resin film according to any one of [1] to [3], wherein filler (D) is silica.

[7] A multilayer printed wiring board comprising an insulating layer obtained by curing the resin film according to any one of [1] to [6].

DETAILED DESCRIPTION OF THE INVENTION

The resin film of the present invention comprises (A) an epoxy resin having two or more glycidyl groups in a molecule, (B) an epoxy resin curing agent, (C) a thermoplastic resin, and (D) a filler, and the resin film has different filler concentrations in thickness direction of the resin film. That is, the filler content in at least either one of the surface regions on the cross-section of the film is less than the filler content in the central region of the film. Here, the surface region on the cross-section of the film means a surface side region in the film, and usually, the region from surface to 5% depth of the whole film (thickness 100%)

The central region of the film is a region located further inside of the film from a surface region, and usually means the region of from 40 to 60% depth of the whole film.

In the resin film of the present invention, the filler content contained in at least either one of the surface regions on the cross-section of the film is less than the filler content contained in the central region.

The whole thickness of the resin film of the present invention is preferably 10 to 100 μm in view of processability, and more preferably 20 to 75 μm.

The resin film of the present invention has different filler content in thickness direction. For example, two or more films having different filler content are laminated and a resin film having filler content in surface region different from that in central region of the film can be obtained.

The film used as surface region has a thickness of 2 to 20 μm, preferably 5 to 10 μm, and has a filler (D) content (based on the total of components (A) to (D)) of 5 to 50% by weight, and preferably 20 to 40% by weight. When the content is less than 5% by weight, or more than 50% by weight, metal plating processability tends to fall.

The film used as central region has a thickness of 8 to 90 µm, and preferably 10 to 65 µm. The filler (D) content has to be more than the filler content of the film used as surface region, and usually it is 30 to 80% by weight, preferably 40 to 70% by weight, and more preferably 40 to 60% by weight. When the content is less than 30% by weight, the thermal expansion coefficient of the insulating layer obtained by curing the resin film tends to become large.

Furthermore, a resin film having different filler content in thickness direction of the resin film of the present invention will be explained concretely.

For example, a resin composition (henceforth "varnish for resin film") is prepared by dissolving or dispersing resin components of (A), (B) and (C), and filler (D) in a non-protonic polar solvent, such as γ-butyrolactone, dimethylformamide (DMF), or N-methylpyrrolidone (NMP).

The varnish for resin film is coated on a support material using a roll coater or a table coater and dried, and 1st resin composition layer is formed on the support material. Then, 2nd resin composition layer, if necessary 3rd or further layer, is formed on the 1st layer as the same manner with using a varnish for resin film having different filler content, and a resin film of the present invention can be obtained by peeling off the laminated resin composition layers. The (A)–(D) components may react partially each other.

As the support material used for production of a resin film, organic films, such as PET (polyethylene terephthalate), and metallic foils, such as a copper foil and aluminum foil, are usually used.

The resin film of the present invention may be a monolayer film having gradient filler content in the thickness direction of the film. As the distribution of a filler in thickness direction in a resin film, the filler content in the region of from the surface (on which a metal wire is formed by plating, etching, etc.) to the depth of 5% thickness (total thickness of the film is 100%) is preferably 5 to 50% by weight, and more preferably 20 to 40% by weight (based on the total of components (A) to (D)). When the content is less than 5% by weight, or more than 50% by weight, metal plating processability tends to fall.

In the central region of the film, that is, in 40 to 60% depth region, the filler (D) content has to be more than the filler content in the surface region, and it is usually 30 to 80% by weight, preferably 40 to 70% by weight, and more preferably 40 to 60% by weight. When the content is less than 30% by weight, the thermal expansion coefficient of the insulating layer obtained by curing the resin film tends to become large. The total thickness of the film is usually 10 to 100 µm.

As a method of producing a film having gradient filler content in the thickness direction, exemplified a method of producing a resin film comprising coating a varnish for resin film on a base material, then allowing to stand for utilizing specific gravity difference between a filler and components other than the filler.

As the epoxy resin (A) having two or more glycidyl groups in a molecule used in the present invention, exemplified are: a phenol novolak type epoxy resin, a cresol novolak type epoxy resin, a bisphenol A type epoxy resin, a bisphenol F type epoxy resin, a bisphenol S type epoxy resin, a biphenyl type epoxy resin, a biphenyl novolak type epoxy resin, a trishydroxyphenylmethane type epoxy resin, a tetra phenylethane type epoxy resin, a dicyclopentadiene phenol type epoxy resin, epoxy resins of hydrogenation compound of an aromatic bisphenol compound and/or a polyphenol compound, cycloaliphatic epoxy resins, such as cyclohexene oxide, a glycidyl amine type epoxy resin, and various derivatives thereof, etc. These can be used alone or as a mixture thereof.

As the epoxy resin (A) having two or more glycidyl groups in a molecule other than the above epoxy resins, an epoxy resin represented by following formula (1) can be exemplified.

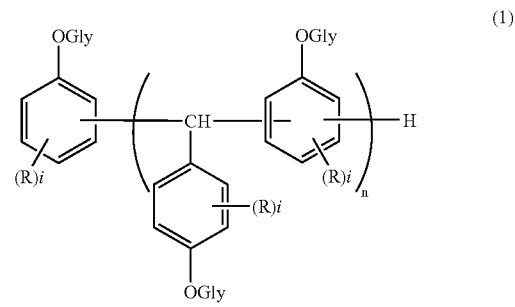

wherein, n represents an average repeating number of 1 to 10; a plurality of R each independently represents hydrogen atom, an alkyl group having 1–10 carbon atoms, an aralkyl group having 6–20 carbon atoms, an aromatic group having 6–20 carbon atoms, a cycloalkyl group having 5–7 carbon atoms, or a hydrocarbon group having 6–20 carbon atoms containing a cycloalkyl group having 5–7 carbon atoms; i each independently represents an integer of 1–4; and Gly represents glycidyl group.

The epoxy resin having the structure shown by the above formula (1) has excellent heat-resistance, and is suitable as the epoxy resin component (A) of the present invention. This epoxy resin can be used in combination with one or more epoxy resins exemplified above.

The compounding amount of the epoxy resin (A) having two or more glycidyl groups in a molecule used in the present invention is not especially limited as long as the object of the present invention can be attained, and it is usually 1% by weight or more based on the total amount of resin components (A) to (C), and preferably 1 to 80% by weight.

The production method of the epoxy resin is not especially limited, and exemplified a method wherein a phenol or its derivative is reacted with an epihalohydrin under existence of alkali, such as sodium hydroxide.

For the resin film of the present invention, a thermosetting resin other than component (A) can be used in the range which does not injure the object of the present invention. Examples thereof include: cyanate resins, such as cyanates of bisphenol A; bismaleimides, such as diaminodiphenylmethane bismaleimide; diamines, such as diaminodiphenylmethane; addition polymers of bismaleimide and diamine; alkenylaryl ethers, such as bis-vinylbenzyl ether compound of bisphenol A, and vinylbenzyl compound of diaminodiphenylmethane; alkynylether, such as dipropargylether of bisphenol A, and dipropargyl compound of diaminodiphenylmethane; Novolak resins, such as a phenol resin and a resol resin; allyl compounds, such as an allyl ether type compound, an allylamine type compound; isocyanates, such as triallylisocyanurate, and triallylcyanurate; and polyolefins, such as a vinyl-group containing polyolefin compound.

The epoxy resin curing agent (B) used in the present invention is not especially limited, and known epoxy resin curing agents can be used. Examples thereof include: polyhydric phenols such as phenol novolak, polycondensation product of phenol, formalin and melamine, and polycondensation product of phenol, formalin and benzoguanamine; amine type curing agents, such as dicyandiamide, diaminodiphenylmethane, and diaminodiphenyl sulfone; and acid anhydride curing agents, such as pyromellitic anhydride, trimellitic anhydride, and benzophenone tetracarboxylic acid, etc. These can be used alone or in combination of two or more. Among them, in view of low water absorptivity, polyhydric phenol is preferable, and polycondensation product of phenol, formalin and melamine (melamine modified phenol novolak) is especially preferable.

Although the compounding ratio of the epoxy resin curing agent (B) can be determined arbitrarily according to the combination with an epoxy resin, the compounding ratio is usually determined so that the glass transition temperature becomes high. For example, when using phenol novolak as the epoxy resin curing agent, it is preferable to compound so that the ratio of the epoxy equivalent to the hydroxyl equivalent is 1:1.

Examples of the thermoplastic resin (C) used in the present invention include: engineer plastics, such as polyphenylene ether, and polycarbonate; super engineer plastics, such as polyether sulfone, polysulfone, polyether imide, and polyimide; polyolefins, such as polyethylene and polybutadiene; polyacrylates, such as a polyacrylate, and a polymethacrylate; and rubbers, such as terminal amine modified or terminal carboxyl group modified polybutadiene-acrylonitrile rubber. Among them, polyether sulfone is preferable in view of toughness and fire retardancy.

Known polyether sulfones whose molecular terminal is halogen atom, alkoxy group, or phenolic hydroxyl group can be used as the above polyether sulfone. Among them, polyether sulfone having phenolic hydroxyl terminatal is especially preferable, in view of compatibility with component (A), reactivity and solvent resistance of the cured product.

Furthermore, the resin film composition of the present invention can contain a component, for example, acrylate, methacrylate, styrene or the like, for providing photo curability to the resin film of the present invention within the range which does not injure the object of the present invention.

Next, component (D) used in the resin film of the present invention will be explained.

The filler (D) used in the present invention, usually has a particle diameter of 0.1 to 20 μm, preferably 0.1 to 5 μm, and more preferably 0.1 to 1 μm.

As the filler (D), either of an organic filler or an inorganic filler can be used. Examples of the organic filler include resin powders, such as epoxy resin powder, melamine resin powder, urea resin powder, guanamine resin powder, and polyester resin powder. Examples of the inorganic filler include inorganic powders, such as silica, alumina, and titanium oxide.

In order to reduce the thermal expansion coefficient, inorganic fillers are preferable, and silica is especially preferable, in view of low dielectric characteristics.

Moreover, a curing catalyst can be used for production of the resin film of the present invention. Examples thereof include: Organic phosphine compounds, such as triphenylphosphine, tri-4-methylphenyl phosphine, tri-4-methoxyphenyl phosphine, tributyl phosphine, trioctyl phosphine, and tri-2-cyano ethyl phosphine, and tetraphenylborate thereof; amines, such as tributyl amine, triethylamine, 1,8-diazabicyclo(5,4,0)undecene-7, and triamylamine; quarternary ammonium salts, such as benzylchloride trimethyl ammonium, hydroxybenzyl trimethyl ammonium, and triethylammonium tetraphenyl borate; and imidazoles, such as 2-ethylimidazole, and 2-ethyl-4-methyl imidazole. Among them, organic phosphine compounds and imidazoles are especially preferable.

The curing catalyst is added in an appropriate amount so that a desired gel time may be obtained. It is preferable to use a curing agent so that the gel time of the composition is from 1 minute to 15 minutes at a previously determined temperature of between 80 and 250° C.

An insulating layer for multilayer printed wiring board can be formed by piling resin films prepared by the above described method on a separately prepared core substrate or on a separately prepared wiring layer of a printed circuit, and curing thereof.

The method of manufacturing a printed circuit is not especially limited. For example, when the resin film is a dry film obtained by forming a resin layer on a support material such as PET, the PET as a support material is peeled off, then the dry film is disposed on a core support, laminated using a molding apparatus such as a vacuum terminator, and cured, thus an insulating layer can be prepared on a core substrate. Next, a metal wiring layer is formed by a method, such as metal plating, on the insulating layer, a dry film is further piled thereon and cured to form an insulating layer. By repeating these process, a multilayer printed wiring board is prepared.

On the other hand, when the resin film is a form of a resin-coated copper foil in which a resin layer is formed on copper foil, the resin-coated copper foil is firstly cured by heating press without peeling off the copper foil as a support material. Then, a copper wiring layer is formed by a techniques, such as etching the copper foil, and a resin film is heat pressed on this wiring layer, and an insulating layer is formed. By repeating these process, a multilayer printed wiring board is prepared.

When a plurality of insulating layers are contained in a multilayer printed wiring board of the present invention, the insulation layers may be prepared either by curing resin films having different composition each other or by curing resin films having the same composition.

For producing the multilayer printed wiring board, each layer of the insulating layer and the wiring layer may be prepared stepwise and alternately, and a multilayer structure may also be produced at a time by a techniques, such as heat pressing.

In the present invention, the content of filler (D) in at least either one of the surface regions on the cross-section of the film comprising components (A) to (D) is less than the content of filler (D) in the central region of the film. By this constitution, it becomes possible to compound a sufficient amount of filler necessary for improvement of the whole resin film performance, with reducing the problem resulting from a filler being excessivelyly distributed near the surface region of the film. Thus, the metal plating processability is improved, and a low thermal-expansion property as the whole resin film is attained.

EXAMPLES

Hereafter, examples of the present invention are shown but the present invention is not limited to these.

Example 1

Each component was mixed as shown in Table 1, using 3 roll mill and varnishes C and D for resin film were obtained.

Varnish C was coated on 38 μm PET film so that the thickness after drying is to be 5 μm, and dried at 80° C. for 30 minutes in a ventilation oven. Then, varnish D was coated on this so that the thickness after drying is to be 35 μm, and dried at 80° C. for 30 minutes in a ventilation oven, and a film having a PET film as support material was obtained. The PET film was peeled off from the film, and a resin film was obtained. The resin film was cured at 180° C. for 2 hours, and a test substrate was obtained. Thermal expansion coefficient was measured using this test substrate. Similarly, the resin film after removing the PET film was cured at 180° C. for 30 minutes, and a test substrate was obtained. Surface roughening was studied using this test substrate. The results are shown in Table 2.

TABLE 1

|  | Varnish C for resin film | Varnish D for resin film |
| --- | --- | --- |
| TMH-574 | 40.7 | 40.7 |
| YD-128M | 10.2 | 10.2 |
| KA-7052-L2 | 19.1 | 19.1 |
| PES5003P | 30.0 | 30.0 |
| 1-FX | 42.9 | — |
| 20X | — | 122.2 |
| KBM-403 | 1.29 | 3.67 |
| 2E4MZ | 0.10 | 0.10 |
| γ-butyrolactone | 269.3 | 220.9 |
| NMP | 67.3 | 55.2 |

In Table 1, the amount of each component are shown in weight ratio.

TMH-574: polyfunctional epoxy resin manufactured by Sumitomo Chemical Co., Ltd. epoxy equivalents is 218 g/eq.

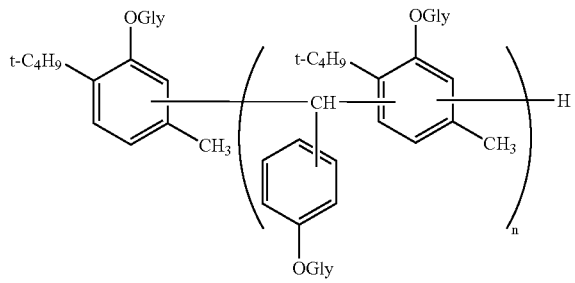

YD-128M: epoxy resin manufactured by Toto Chemical Co., epoxy equivalents is 185.5 g/eq.

KA-7052-L2: epoxy curing agent (melamine modified phenol novolak, hydroxyl equivalents 113 g/eq) manufactured by Dainippon Ink and Chemicals Inc.

PES5003P: polyether sulfone (terminal hydroxyl group) manufactured by Sumitomo Chemical Co., Ltd. 1-FX: silica (mean particle diameter 0.4 μm) manufactured by Tatsumori, Ltd.

20-X: silica (mean particle diameter 0.7 μm) manufactured by Denki Kagaku Kogyo K.K.

KBM-403: epoxy silane coupling agent manufactured by Shin-Etsu Chemical Co., Ltd.

2E4MZ: 2-ethyl-4-methyl imidazole manufactured by Shikoku Chemicals Corp.

NMP: N-methylpyrrolidone

Comparative Example 1

Varnish D of Table 1 was used alone, and a test substrate was produced by the same manner with Example 1. The results of thermal expansion coefficient and surface roughening are shown in Table 2.

Physical properties described in the table were measured by the following methods.

Thermal expansion coefficient: The average of the thermal expansion coefficient (ppm/° C.) in the range of 50 to 100° C. measured by TMA method.

Surface roughening: Test sample was exposed in permanganic acid solution at 80° C. for 20 minutes, and roughening state of the surface was observed by SEM. ○ shows sufficient surface roughening, x shows insufficient surface roughening

TABLE 2

|  | Example 1 | Comparative Example 1 |
| --- | --- | --- |
| Thermal expansion coefficient | 25 ppm | 23 ppm |
| Surface roughening test | ○ | x |

The cured product of the resin film of the present invention is tough, and has a high fire retardancy, a low thermal expansion property, and good metal plating processability.

What is claimed is:

1. A resin film comprising (A) an epoxy resin having two or more glycidyl groups in a molecule, (B) an epoxy resin curing agent, (C) a thermoplastic resin, and (D) a filler, wherein the filler content in at least either one of the surface regions on the cross-section of the film is less than the filler concentration in the central region.

2. A resin film according to claim 1, wherein two or more films are laminated.

3. A resin film according to claim 1 or 2, wherein epoxy resin (A) having two or more glycidyl groups in a molecule is represented by following formula (1)

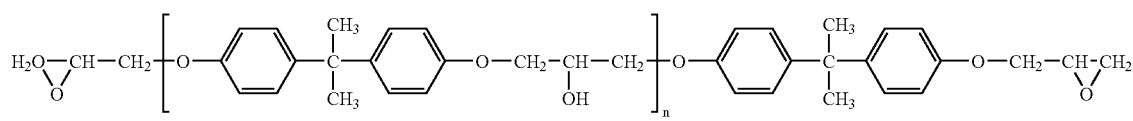

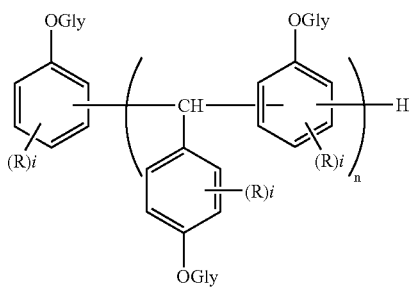

(1)

wherein, n represents an average repeating number of 1 to 10; a plurality of R each independently represents hydrogen atom, an alkyl group having 1–10 carbon atoms, an aralkyl group having 6–20 carbon atoms, an aromatic group having 6–20 carbon atoms, a cycloalkyl group having 5–7 carbon atoms or a hydrocarbon group having 6–20 carbon atoms containing a cycloalkyl group having 5–7 carbon atoms; i each independently represents an integer of 1–4; and Gly represents glycidyl group.

4. A resin film according to claims 1 or 2, wherein epoxy resin curing agent (B) is phenol novolak.

5. A resin film according to claims 1 or 2, wherein thermoplastic resin (C) is polyether sulfone.

6. A resin film according to claims 1 or 2, wherein filler (D) is silica.

7. A multilayer printed wiring board comprising an insulating layer obtained by curing the resin film according claims 1 or 2.

8. A resin film according to claim 3, wherein epoxy resin curing agent (B) is phenol novolak.

9. A resin film according to claim 3, wherein thermoplastic resin (C) is polyether sulfone.

10. A resin film according to claim 3, wherein filler (D) is silica.

11. A multilayer printed wiring board comprising an insulating layer obtained by curing the resin film according to claim 3.

12. A multilayer printed wiring board comprising an insulating layer obtained by curing the resin film according to claim 4.

13. A multilayer printed wiring board comprising an insulating layer obtained by curing the resin film according to claim 5.

14. A multilayer printed wiring board comprising an insulating layer obtained by curing the resin film according to claim 6.

15. A multilayer printed wiring board comprising an insulating layer obtained by curing the resin film according to claim 8.

16. A multilayer printed wiring board comprising an insulating layer obtained by curing the resin film according to claim 9.

17. A multilayer printed wiring board comprising an insulating layer obtained by curing the resin film according to claim 10.

* * * * *